United States Patent
Park

(10) Patent No.: US 6,914,847 B1
(45) Date of Patent: Jul. 5, 2005

(54) SEMICONDUCTOR MEMORY DEVICE

(75) Inventor: Byung-Il Park, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/789,657

(22) Filed: Feb. 27, 2004

(30) Foreign Application Priority Data

Dec. 29, 2003 (KR) .................................. 10-2003-0098431

(51) Int. Cl.$^7$ ................................................. G11C 8/00
(52) U.S. Cl. ............................. 365/230.03; 365/189.05; 365/189.03; 365/230.05
(58) Field of Search ..................... 365/230.03, 189.05, 365/189.03, 230.05

(56) References Cited

U.S. PATENT DOCUMENTS 5,870,572 A * 2/1999 Garcia ........................ 710/310
5,956,285 A * 9/1999 Watanabe et al. ......... 365/230.03

* cited by examiner

Primary Examiner—Van Thu Nguyen
Assistant Examiner—N Nguyen
(74) Attorney, Agent, or Firm—Blakely Sokoloff Taylor & Zafman

(57) ABSTRACT

A semiconductor memory device having a bank for storing a data and a port as a data I/O terminal includes a global data bus for flowing an appearing current corresponding to the a data; a plurality of first transceivers, in response to the inputted instruction, for delivering the data between a bank to the global data bus; a plurality of first switching blocks, each for selectively connecting the global data bus to each of the plurality of first transceivers; a plurality of second transceivers, in response to the inputted instruction, for delivering the data between a port and the global data bus; and a plurality of second switching blocks, each for selectively connecting the global data bus to each of the plurality of the second transceivers.

13 Claims, 6 Drawing Sheets

SEMICONDUCTOR MEMORY DEVICE

FIELD OF THE INVENTION

The present invention relates to a semiconductor memory device; and, more particularly, to an apparatus and a method for retrieving a data stored in a bank of the semiconductor memory device.

DESCRIPTION OF PRIOR ART

Generally, a bus is defined as a data path among some functional blocks inside a system or a device. Likewise, a semiconductor memory device has two kinds of bus, i.e. a local data bus and a global data bus. The local data bus is used inside a core area, e.g. a bank, but the global data bus serves as a path for delivering a data inputted from a data I/O port into the core area or delivering a data outputted from the core area into the data I/O port.

FIG. 1 is a block diagram showing a data path of a conventional semiconductor memory device.

As shown, the conventional semiconductor memory device includes a port 14, a bank 16, a global data bus GIO, a first transceiver 10 and a second transceiver 20. The global data bus GIO is located between the port 14 and the bank 16. The first transceiver 10 is coupled between the port 14 and the global data bus GIO, and the other is coupled between the bank 16 and the global data bus GIO.

Each transceiver, e.g. 10 and 20, has a transmitter and a receiver. Namely, the first transceiver 10 includes a first transmitter QTx for loading an inputted data from the port 14 into the global data bus GIO and a first receiver QRx for delivering a loaded data of the global data bus GIO to the port 14. In addition, the second transceiver 20 includes a second transmitter Tx for loading an output data from the bank 16 into the global data bus GIO and a second receiver Rx for delivering a loaded data of the global data bus GIO to the bank 16.

FIG. 2 is a schematic diagram describing the second transmitter Tx and the first receiver QRx shown in FIG. 1.

As shown, the second transmitter 22 (Tx) includes two MOS transistor. One MP is a pull-up PMOS transistor having a gate, a drain and a source: wherein the gate receives a first output data signal aaa from the bank 16; the drain is supplied with a core voltage source VCC; and the source is coupled to the global data bus GIO. The other NP is a pull-down NMOS transistor having a gate, a drain and a source: wherein the gate receives a second output data signal bbb from the bank 16; the drain is supplied with the ground VSS; and the source is coupled to the global data bus GIO and the source of the pull-up PMOS transistor MP. Moreover, the first receiver 14 (QRx) is constituted with one CMOS inverter INV.

Furthermore, in a view of the structure, the first transmitter QTx is identical to the second transmitter 22 and the second receiver Rx is same to the first receiver 14.

If the first and second data signals aaa and bbb are a logic low level, the pull-up transistor MP of the second transmitter 22 is turned on. Then, the global data bus GIO is supplied with a logic high level level. Next, the first receiver 14 inverts a logic high level voltage of the global data bus GIO to output the inverse signal, i.e. the a logic low level voltage, as the data signal ccc.

In the contrast, if the first and second data signals aaa and bbb are a logic high level, the pull-down transistor MN of the second transmitter 22 is turned on. Then, the global data bus GIO is supplied with a logic low level level. Next, the first receiver 14 inverts a logic low level voltage of the global data bus GIO to output the inverse signal, i.e. the a logic high level voltage, as the data signal ccc.

Herein, if the first data signal aaa is a logic low level and the second data signal bbb is a logic high level, the output terminal of the second transmitter 22 is a high impedence (Hi-Z). But, when the first data signal aaa is a logic high level and the second data signal bbb is a logic low level, the second transmitter 22 is disabled.

As described above, the described operation is applied to the first transmitter QTx of the first transceiver 10 and the second receiver Rx of the second transceiver 20.

Typically, for increasing a band width, the global data bus includes a plurality of bus lines. For example, in a double data rate II dynamic random access memory (hereinafter, referred as a DDR2 DRAM) which has the widest band with of the semiconductor memory device, the global data bus includes 64 number of bus lines.

In the case that the number of bus lines included in the global bus line is equal to or under 64, a current consumption is not a critical issue though a voltage level of a data passing through the global bus line is varied from the ground to the core voltage source VCC, i.e. a swing range of the data is wide. Namely, the current consumption is not seriously large.

However, if the number of bus lines included in the global bus line is above 64, e.g. the number of bus lines is 128, 256 or 512, the current consumption is rapidly increased because the swing range of the data is wide.

FIG. 3 is a schematic diagram describing a transmitter and a receiver of each transceiver included in the conventional semiconductor memory device disclosed in a commonly owned copending application, U.S. Ser. No. 10/788,704, filed on Feb. 27, 2004, entitled "SEMICONDUCTOR MEMORY DEVICE", which is incorporated herein by reference.

As shown, there are a transmitter 100, a receiver 200 having a current mirror block 210 and a latch block 220. Herein, the transmitter 100 coupled between a port and a global data bus GIO is for delivering a data inputted from the port to the global data bus GIO. Also, for delivering the data loaded in the global data bus GIO to a bank, the receiver 200 are coupled between the global data bus GIO and the bank.

Furthermore, referring to FIG. 1, the transmitter 100 has the function in response to the first transmitter QTx of the first transceiver 10; and the receiver 210 having the current mirror block 210 and the latch block 220 has the function in response to the second receiver RX of the second transceiver 20.

The transmitter 100 includes a first NMOS transistor MN1. A gate of the NMOS transistor MN1 receives a data signal cdio, a drain of the NMOS transistor is connected to a ground and a source of the NMOS transistor is coupled to the global data bus GIO. Herein, the first NMOS transistor MN1 serves as a pull-down driver.

In the receiver 200, the current mirror block 210 includes a current mirror 212 for mirroring an appearing current of the global data bus GIO; a current control block 214 coupled between the current mirror 212 and the global data bus GIO for controlling amount of the appearing current; and a switching block 216 coupled to the current control block 214 for enabling the output of the current mirror in response to a data control signal cp. Herein, the current control block 214 is controlled by a reference voltage vrtb.

Herein, the current mirror 212 include a first PMOS transistor MP1 having a gate, a drain and a source, the gate and drain diode-connected, the source connected to a supply voltage vtl; and a second PMOS transistor MP2 having a gate, a drain and a source, the drain connected to an output node, the source connected to the supply voltage vtl, the gate connected to the gate of the first PMOS transistor MP1. Also, the current control block 214 include a second NMOS transistor MN2 having a gate, a drain and a source, the gate coupled to the reference voltage vrtb, the source connected to the drain of the first PMOS transistor MP1 and the drain connected to the global data bus GIO; and a third NMOS transistor MN3 having a gate, a drain and a source, the gate coupled to the reference voltage vrtb, the source connected to the drain of the second PMOS transistor MP2. In addition, the switching block 216 include a fourth NMOS transistor MN4 having a gate, a drain and a source, the gate coupled to the data control signal cp, the source connected to the drain of the second NMOS transistor MP2 and the drain connected to the ground VSS.

The latch block 220 include an inverting block 222 controlled by the data control signal cp and the inverse data control signal cpb for inverting the mirrored voltage outputted from the current mirror block 210; and a latch 224 having two loop-connected inverters INV1 and INV2 for latching the inverse mirrored voltage as the data to output the, data into the bank.

In detail, the inverting block 222 includes a third PMOS transistor MP3 having a gate, a drain and a source, the gate coupled to the inverse data control signal cpb, the source connected to the supply voltage vtl; a fourth PMOS transistor MP4 having a gate, a drain and a source, the gate coupled to the mirrored voltage outputted from the current mirroring block 210, the source connected to the drain of the third PMOS transistor MP3, the drain coupled to the latch 224; a fifth NMOS transistor MN5 having a gate, a drain and a source, the gate coupled to the data control signal cp, the drain connected to the ground VSS; and a sixth NMOS transistor MN6 having a gate, a drain and a source, the gate coupled to the mirrored voltage outputted from the current mirroring block 222, the drain connected to the source of the fifth NMOS transistor MN5, the source coupled to the latch 224.

Briefly, the receiver 200 includes the current mirror block 210 for mirroring the appearing current of the global data bus GIO to output a mirrored voltage as the data; and the latch block 220 for inverting the mirrored voltage outputted from the current mirror block 210 and latching the converse mirrored voltage as the data to output the data into the bank.

As mentioned above, another transmitter and receiver, which are used for retrieving a data stored in the bank and delivering the data into the port, are same structure with the transmitter 100 and the receiver 200.

Herein, the reference voltage vrtb being a kind of direct voltage has a predetermined level based on a length of the global data bus GIO, an operation frequency and like this.

FIG. 4 is a waveform demonstrating a simulation result of the transmitter 100 and the receiver 200 shown in FIG. 3.

The data control signal cp is a kind of high active pulse having a predetermined active period, e.g. 1tCK (1 external clock cycle) when an instruction such as a write or read command is inputted.

Hereinafter, referring to FIGS. 3 and 4, an operation of the transmitter and the receiver included in the semiconductor memory device in accordance with the present invention is described in detail.

First, if the data signal cdio is a logic high level, the first NMOS transistor MN1 is turned on. Then, on the global data bus GIO, the appearing current flows. Namely, the appearing current is generated at a current path throughout the first PMOS transistor MP1, the second NMOS transistor MN2, the global data bus GIO and the first NMOS transistor MN1 between the source voltage vtl and the ground VSS. Herein, a voltage supplied on the global data bus in response to the appearing current is equal to or lower than vtl−Vtp, i.e. the value of subtracting the supply voltage vtl from a threshold voltage of the first PMOS transistor MP1. As a result, by the current mirror 212, the mirrored voltage of an output node A between the second PMOS transistor MP2 and the third NMOS transistor MN3 becomes a logic high level.

At that time, if the fourth NMOS transistor MN4 is turned on by the data control signal cp, the mirrored voltage of the output node A is unstable. Thus, the second PMOS transistor MP2 must be designed in a size for preventing that the mirrored voltage of the output node is rapidly decreased.

Then, if the data control signal cp is a logic high level, the third PMOS transistor MP3 and the fifth NMOS transistor MN5 are turned on. At this time, if the mirrored voltage being a logic high level, the sixth NMOS transistor MN6 is turned on and an first node B is a logic low level. Then, the latch 224 coupled to the first node B keeps outputting a logic high level until a voltage level of the first node B is changed after the data control signal cp is activated next time.

In the other case that the data signal cdio is inputted a logic low level, the first NMOS transistor MN1 in the transmitter 100 is turned off. As a result, the appearing current is not generated at the current path between the supply voltage vtl and the ground VSS. Thus, the first and second PMOS transistors in the current mirror 212 are turned off. At this time, if the fourth NMOS transistor MN4 is turned on by the data control signal cp, the mirrored voltage of the output node A goes down, i.e. a logic low level.

Then, if the data control signal cp is a logic high level, the third PMOS transistor MP3 and the fifth NMOS transistor MN5 are turned on. At this time, if the mirrored voltage being a logic low level, the fourth PMOS transistor MP4 is turned on and the first node B is a logic high level. Then, the latch 224 coupled to the first node B keeps outputting a logic low level until the voltage level of the first node B is changed after the data control signal cp is activated next time.

In the receiver 200, level of the supply voltage is about 1.8 V. Thus, if the data signal cdio is a logic high level, voltage level of the global data bus GIO is slightly higher than 0 V; and, otherwise, the voltage level of the global data bus GIO is under about 1 V because of the threshold voltage of MOS transistor. Namely, in the present invention, a swing range of voltage level supplied to the global data bus GIO is narrow, i.e. about 1 V. In contrast, in the prior art, if a swing range of the data signal is from about 0 V to about 2 V, e.g. cdio as shown in FIG. 4, the swing range of the voltage level supplied to the global data bus GIO is wide, i.e. about 2 V. Thus, the semiconductor memory device in accordance with the present invention can minimize a current consumption at the global data bus GIO because the swing range of the voltage level supplied to the global data bus GIO is much narrow. As a result, although the global data bus GIO has a plurality of bus line over 128 lines, e.g. 256 lines or 512 lines, the current consumption of the global data bus GIO in the semiconductor memory device is satisfactory.

In the other hand, for reducing the current consumption, the transmitter 100 can consist of a pull-up driver, e.g. one PMOS transistor, not the pull-down driver, e.g. the first NMOS transistor MN1 as shown in FIG. 3. However, in this case that the transmitter 100 consists of the pull-up driver, a size of the pull-up driver should be larger twice than that of the pull-down driver. Thus, the pull-up driver is not proper choice for the transmitter in the semiconductor memory device.

Moreover, referring to FIG. 1, each of the transmitter 100 and the receiver 200 described in FIG. 3 can be also applied to each of the second transmitter Tx of the second transceiver 20, which is coupled to the bank, and the first receiver QRx of the first transmitter 10, which is coupled to the port.

As described above, the semiconductor memory device in accordance with the present invention has an effect with minimizing current amount flowing on the global data bus. As a result, the global data bus in the semiconductor memory device has a plurality of bus lines, e.g. 128, 256 and 512, more than the conventional semiconductor memory device has.

Typically, the semiconductor memory device has a plurality of banks and a plurality of ports and one global data bus GIO is coupled to the plurality of banks and the plurality of ports. Thus, for delivering a data between the plurality of banks and ports, the global data bus GIO is connected to a plurality of transceiver for delivering the data between the global data bus GIO and the bank or between the global data bus GIO and the port.

However, the receiver shown in FIG. 3 is always turned on because the reference voltage vrtb is supplied to gates of the second and third NMOS transistors MN2 and MN3. Thus, the receiver even consumes the current when the receiver is not operated.

At a predetermined timing in an operation of the semiconductor memory device, though the plurality of transceiver are coupled to one bus line of the global data bus GIO, only one pair of the transmitter and receiver interchanges the data with each other throughout the one bus line. Therefore, the current consumption is occurred at all unused transceivers, which are coupled to the global data bus GIO, at a predetermined timing besides operated transceivers.

SUMMARY OF THE INVENTION

It is, therefore, an object of the present invention to provide a semiconductor memory device for minimizing a current consumption in receivers of actually unused transceivers at a predetermined timing in the case when the semiconductor memory device includes a transceiver using a current detecting method for capturing a data in a global data bus.

In accordance with an aspect of the present invention, there is provided a semiconductor memory device having a bank for storing a data and a port as a data I/O terminal including a global data bus for flowing an appearing current corresponding to the a data; a plurality of first transceivers, in response to the inputted instruction, for delivering the data between a bank to the global data bus; a plurality of first switching blocks, each for selectively connecting the global data bus to each of the plurality of first transceivers; a plurality of second transceivers, in response to the inputted instruction, for delivering the data between a port and the global data bus; and a plurality of second switching blocks, each for selectively connecting the global data bus to each of the plurality of the second transceivers, wherein a swing range of a data bus voltage in response to the appearing current is narrower than a gap between a supply voltage and a ground.

BRIEF DESCRIPTION OF DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a semiconductor memory device for minimizing a current consumption according to the present invention will be described in detail referring to the accompanying drawings.

Figure 5:
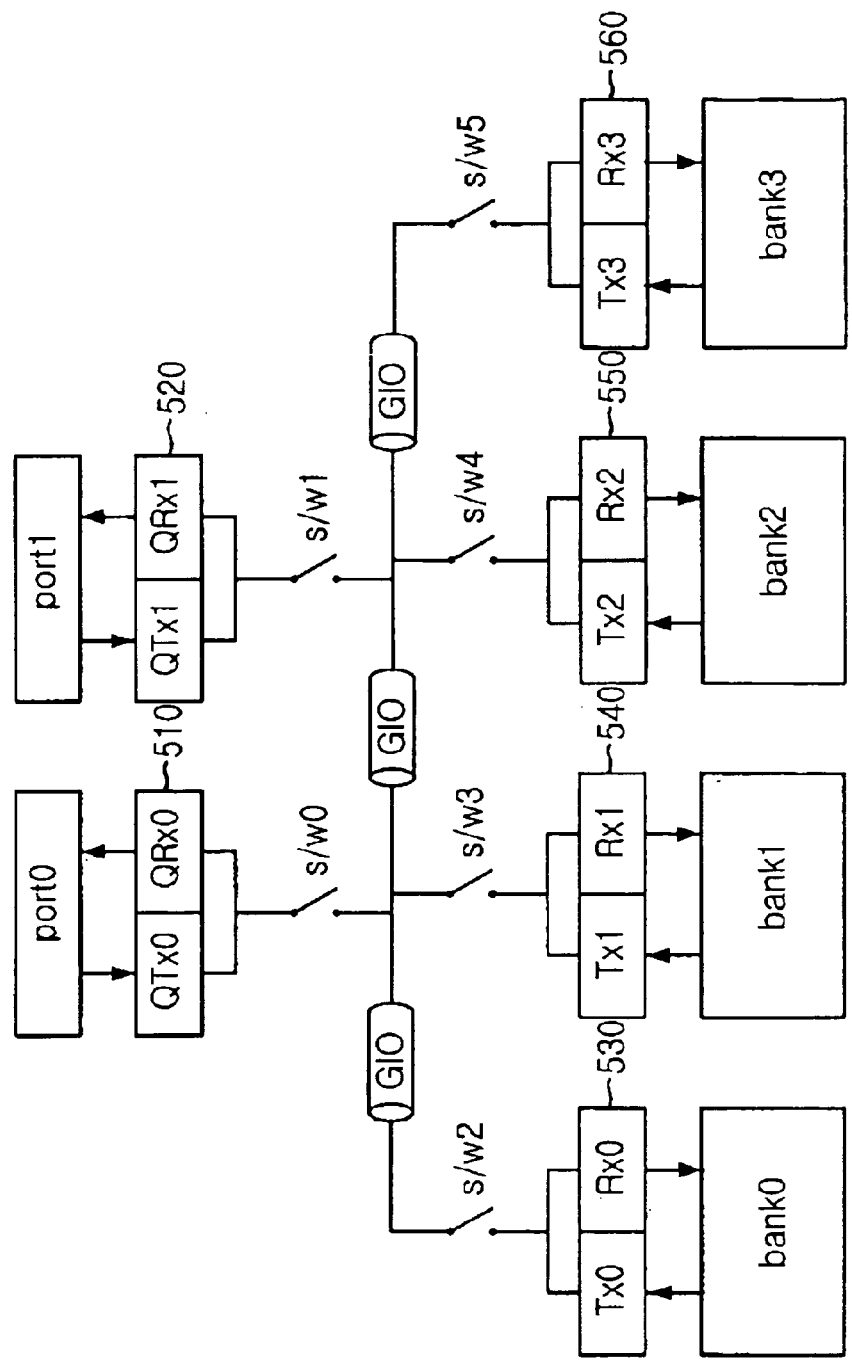
FIG. 5 is a block diagram showing a data path of a semiconductor memory device in accordance with the present invention.

FIG. 5 is a block diagram showing a data path of a semiconductor memory device in accordance with the present invention.

As shown, the semiconductor memory device includes a plurality of I/O ports port0 and port1, a plurality of banks bank0, bank1, bank2 and bank3, a global data bus GIO located between the plurality of I/O ports port0 and port1 and the plurality of banks bank0, bank1, bank2 and bank3, a plurality of first transceivers 530, 540, 550 and 560 for interchanging a data between the global data bus GIO and the plurality of banks bank0, bank1, bank2 and bank3, a plurality of first switches s/w2, s/w3, s/w4 and s/w5, each for connecting or disconnecting the global data bus GIO to each of the plurality of banks bank0, bank1, bank2 and bank3, a plurality of second transceivers 510 and 520 for interchanging a data between the global data bus GIO and the plurality of I/O ports port0 and port1, and a plurality of second switches s/w0 and s/w1, each for connecting or disconnecting the global data bus GIO to each of the plurality of I/O ports port0 and port1.

Namely, in the semiconductor memory device in accordance with the present invention, the plurality of first switches s/w2, s/w3, s/w4 and s/w5 are located between the global data bus GIO and the plurality of banks bank0, bank1, bank2 and bank3. In addition, if a semiconductor memory device has a plurality of I/O ports, i.e. a multi-port semiconductor memory device, like the semiconductor memory device as shown in FIG. 5, the plurality of second switches s/w1 and s/w2 are located between the global data bus GIO and the plurality of I/O ports port0 and port1. Otherwise, if a semiconductor memory device dose not have a plurality of I/O ports, a second switch, e.g. s/w1 and s/w2, is not necessary.

Figure 6:
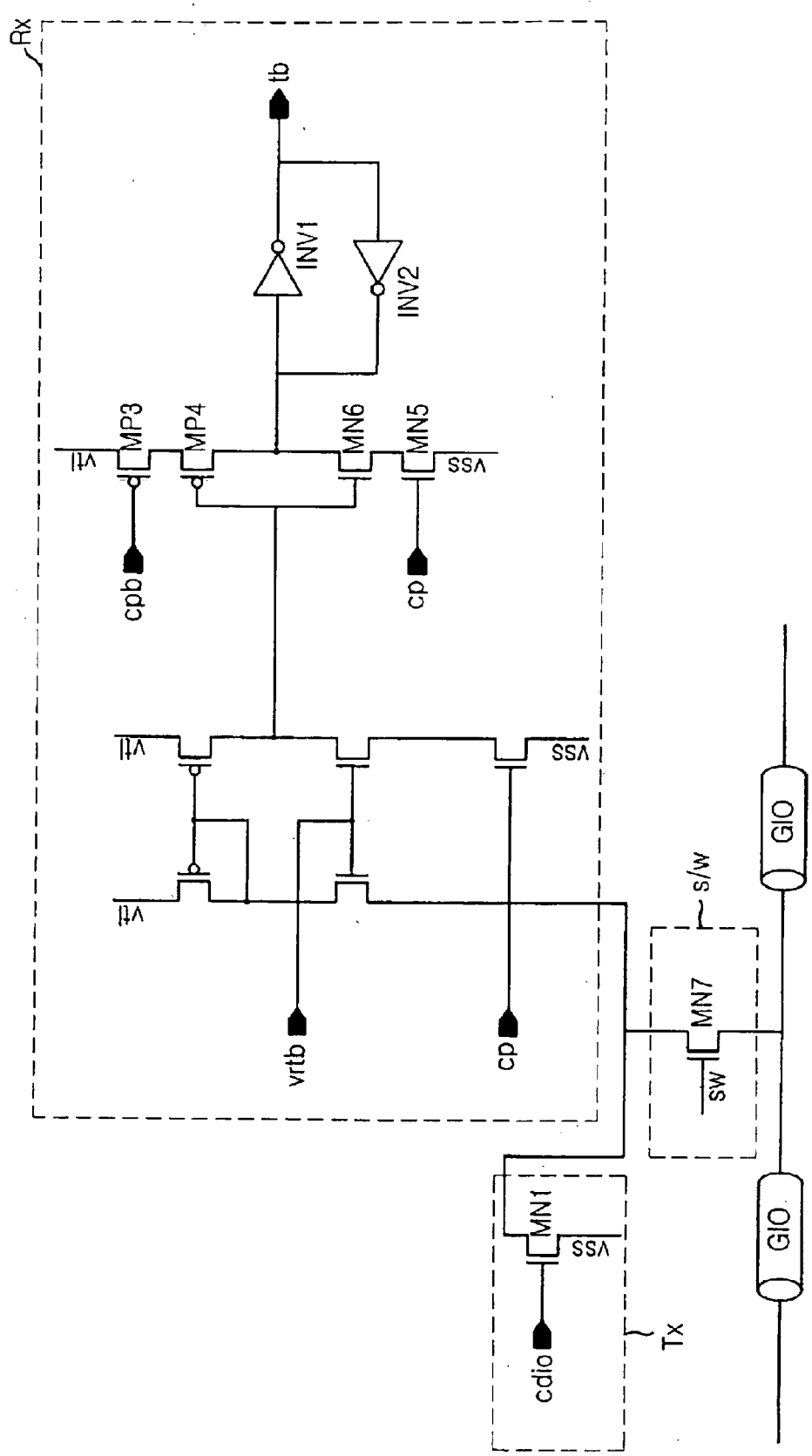
FIG. 6 is a schematic diagram describing a transceiver and a switch shown in FIG. 5.

FIG. 6 is a schematic diagram describing the first transceiver, e.g. 10, and the switch s/w shown in FIG. 5.

Figure 1:
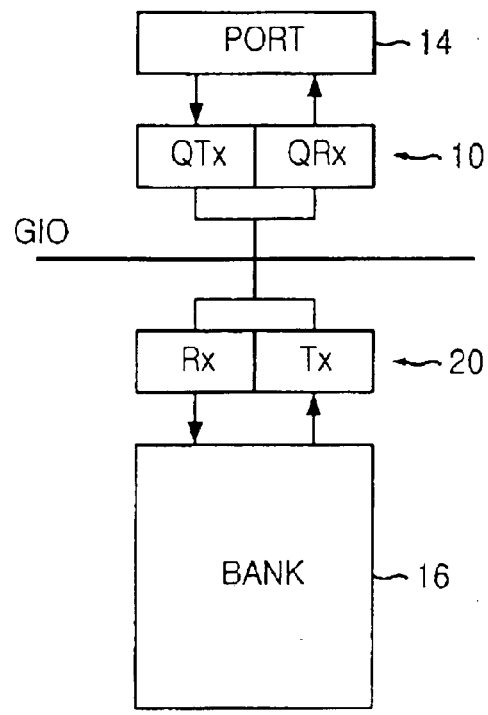
FIG. 1 is a block diagram showing a data path of a conventional semiconductor memory device.
Figure 2:
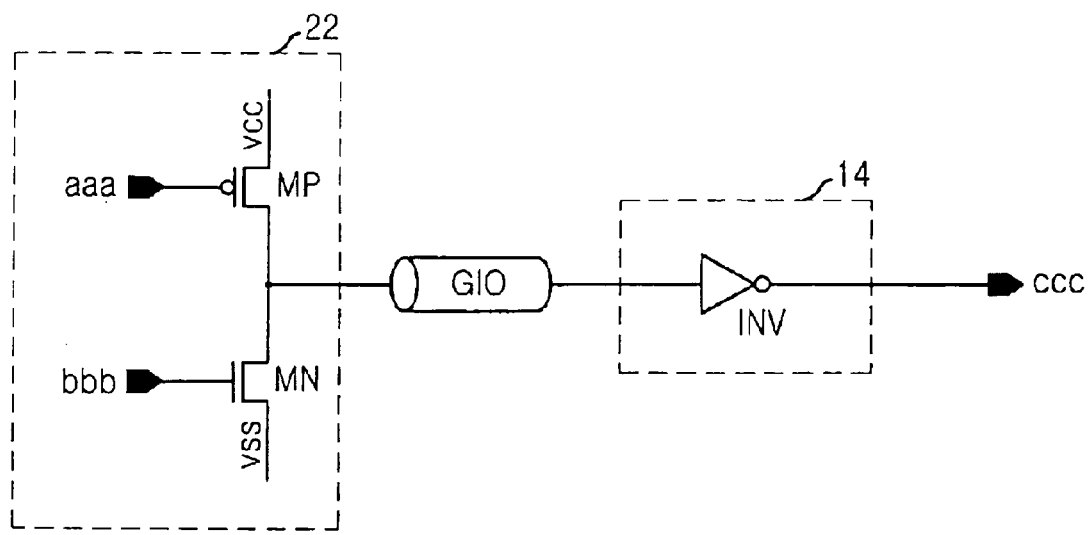
FIG. 2 is a schematic diagram describing a transmitter and a receiver shown in FIG. 1.
Figure 3:
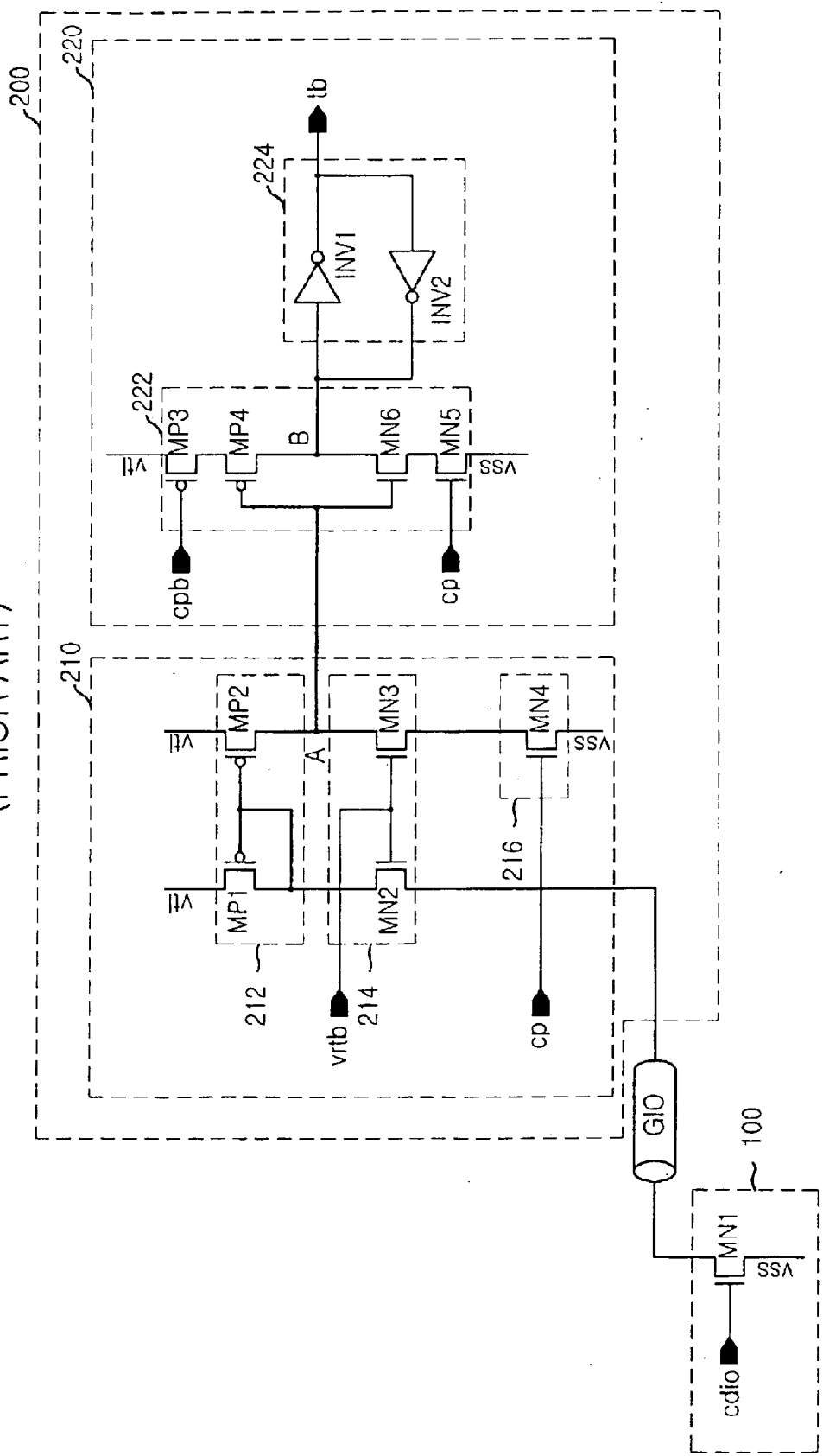
FIG. 3 is a schematic diagram describing a transmitter and a receiver in a conventional semiconductor memory device.
Figure 4:
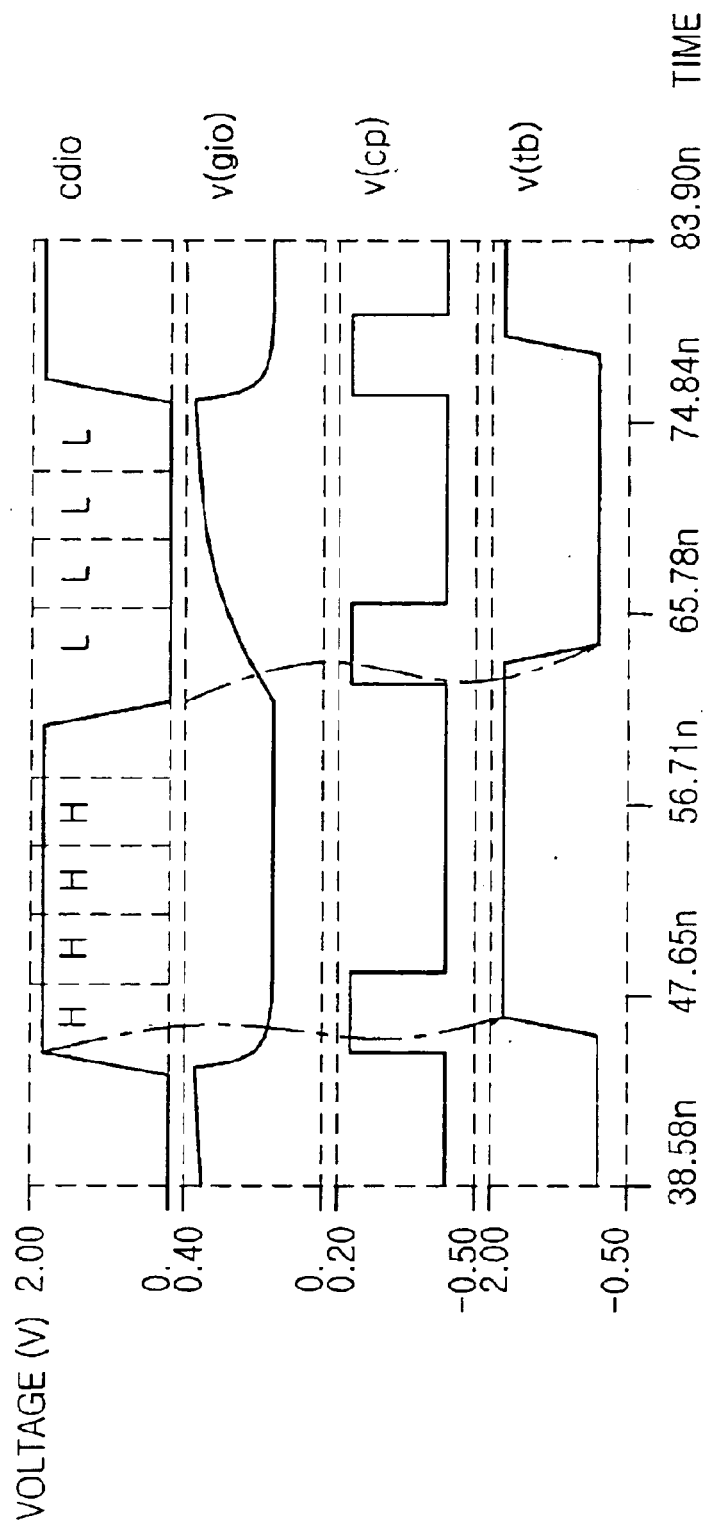
FIG. 4 is a waveform demonstrating a simulation result about a current consumption of the transmitter and the receiver shown in FIG. 3.

As shown, a transmitter Tx and a receiver Rx included in the first transceiver 510 is the same to a transmitter 100 and a receiver 200 shown in FIG. 3. Thus, a structure and an operation of the transceiver 10 Tx and Rx are not described here.

Herein, the switch s/w is constituted with a NMOS transistor MN7 having a gate, a drain and a source, the gate coupled to a first switch control signal sw, each of the drain and the source coupled to each of the transceiver Tx and Rx and the global bus line GIO. The first switch control signal sw is generated in response to an instruction related to the bank which responds to the first transceiver. The instruction is a kind of a read command, a write command and etc.

In the other hand, yet only first transceiver is described in FIG. 6, a structure and an operation of the second transceiver, e.g. 510, are the same to those of the first transceiver. Also, the second switch has the same structure with the first switch, but a second switch control signal for controlling the second switch is generated in response to the port, which receives a data, and the instruction, e.g. the read command and the write command.

Furthermore, if the semiconductor memory device has a plurality of global data buses, each bank and each port should have a plurality of the transceiver and the switch as many as the number of global data buses.

The following table 1 shows a state of the plurality of first and second switches, s/w0, s/w1, s/w2, s/w3, s/w4 and s/w5 in response to the data paths between each of the plurality of banks bank0, bank1, bank2 and bank3, and each of the plurality of I/O ports port0 and port1.

TABLE 1 state of first and second switches

| | s/w0 | s/w1 | s/w2 | s/w3 | s/w4 | s/w5 |
|---|---|---|---|---|---|---|
| Bank0 ⇔ port0 | 0 | X | 0 | X | X | X |
| Bank0 ⇔ port1 | X | 0 | 0 | X | X | X |
| Bank1 ⇔ port0 | 0 | X | X | 0 | X | X |
| Bank1 ⇔ port1 | X | 0 | X | 0 | X | X |
| Bank2 ⇔ port0 | 0 | X | X | X | 0 | X |
| Bank2 ⇔ port1 | X | 0 | X | X | 0 | X |
| Bank3 ⇔ port0 | 0 | X | X | X | X | 0 |
| Bank3 ⇔ port1 | X | 0 | X | X | X | 0 |

(Herein, O is designated as a turn-on state and X represents a turn-off state)

Referring to table 1 and FIG. 5, in the case when a data is delivered between the bank, e.g. bank0, and the I/O ports, e.g. port0, the first switch, e.g. s/w2, which is coupled between the bank, e.g., bank0 and the first transceiver, e.g. 30, including a transmitter, e.g. Tx0, and a receiver, e.g. Rx0, and the second switch, e.g. s/w0, which is coupled between the port, e.g. port0, and the second transceiver, e.g. 10, including a transmitter, e.g. QTx0, and a receiver, e.g. QRx0 are turned on. At this time, all of the first and second switches, e.g. s/w1, s/w3, s/w4 and s/w5 except s/w0 and s/w2 are turned off. Likewise, in other cases, some of the first and second switches, which are used for delivering a data between each of the ports and each of the banks, is turned on and the other of the first and second switches, which are used for delivering the data between each of the ports and each of the banks, is turned off.

Therefore, in the present invention, the current consumption generated from unused transceivers, which is not used for delivering a data between each of the ports and each of the banks, is prevented because all of unused transceivers except operated transceivers for delivering the data between each of the ports and each of the banks are disconnected to the global data bus GIO.

Figure 7:
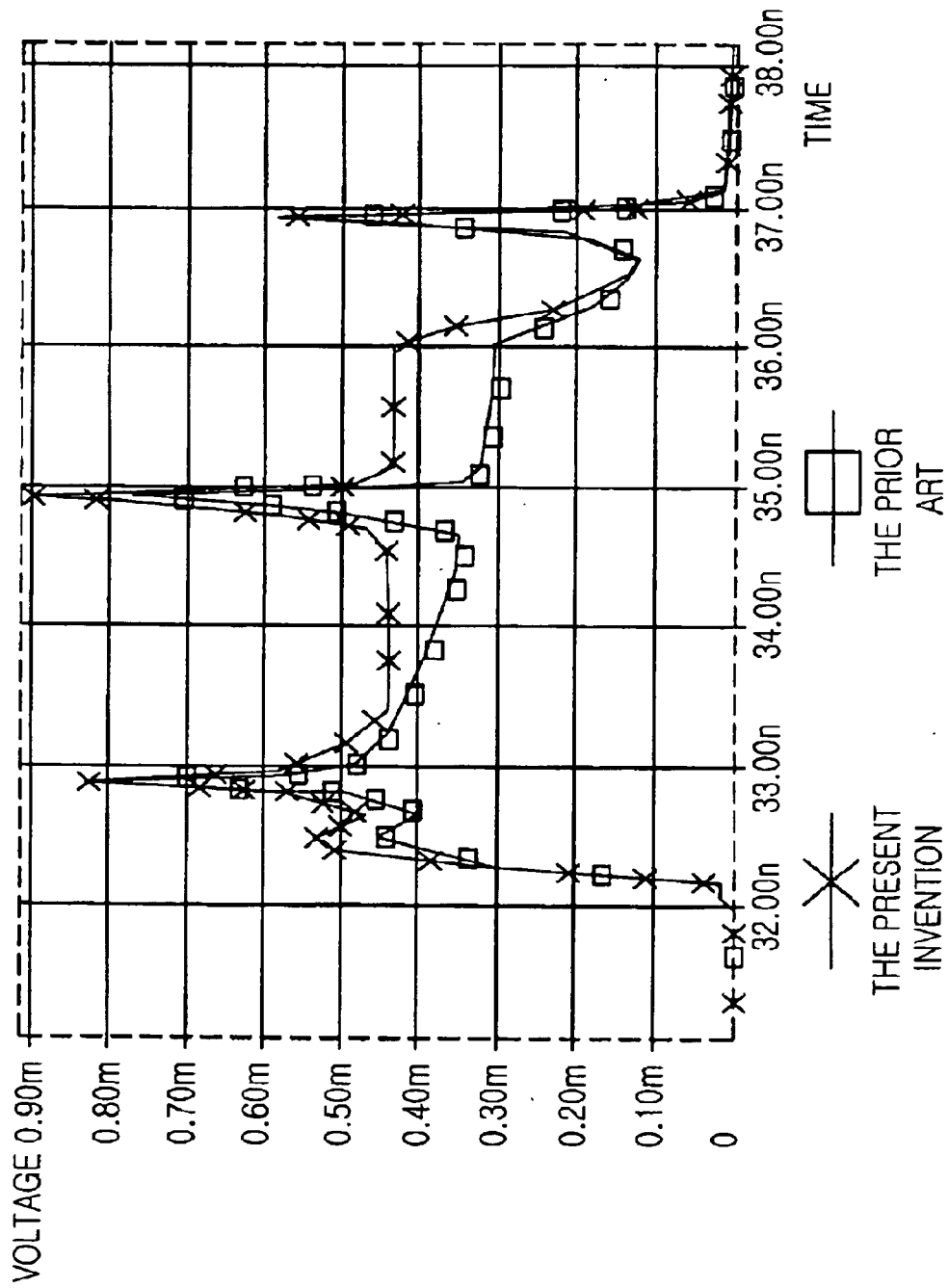
FIG. 7 is a waveform demonstrating a simulation result about a current consumption of the semiconductor memory device in accordance with the present invention, as compared with that of the conventional semiconductor memory device shown in FIG. 3.

FIG. 7 is a waveform demonstrating a simulation result about a current consumption of the semiconductor memory device in accordance with the present invention, as compared with that of the conventional semiconductor memory device shown in FIG. 3.

As shown, the semiconductor memory device in accordance with the present invention can averagely cut about 18% of the current consumption in comparison of the conventional semiconductor memory device.

Moreover, as described above, the semiconductor memory device includes two kinds of switches, i.e. one is coupled between the bank and the global data bus and the other is coupled between the port and the global data bus. However, if the semiconductor memory device does not include a multi-port, i.e. the data path between the port and the global data bus is fixed, the switch is necessary between the bank and the global data bus.

In addition, though the switch as mentioned above has a NMOS transistor, the switch can be constituted with other switching elements, e.g. a PMOS transistor, a bipolar transistor and the like.

Furthermore, for reducing the current consumption, the present invention can be applied in an apparatus including transceiver using a current detecting method for delivering a data, an instruction and etc.

While the present invention has been described with respect to the particular embodiments, it will be apparent to those skilled in the art that various changes and modification may be made without departing from the spirit and scope of the invention as defined in the following claims.

What is claimed is:

1. A semiconductor memory device having a bank for storing a data and a port as a data I/O terminal, comprising:
   a global data bus for flowing an appearing current corresponding to the a data;
   a plurality of first transceivers, in response to the inputted instruction, for delivering the data between a bank to the global data bus;
   a plurality of first switching blocks, each for selectively connecting the global data bus to each of the plurality of first transceivers;
   a plurality of second transceivers, in response to the inputted instruction, for delivering the data between a port and the global data bus; and
   a plurality of second switching blocks, each for selectively connecting the global data bus to each of the plurality of the second transceivers,
   wherein a swing range of a data bus voltage in response to the appearing current is narrower than a gap between a supply voltage and a ground.

2. The semiconductor memory device as recited in claim 1, wherein each of the first and second transceivers includes:
   a transmitter, having a pull-down driver controlled by a control signal, for delivering the data inputted from the port or retrieved from the bank; and a receiver for sensing the appearing current by using a current-mirror and delivering the data corresponding to the sensed appearing current into one of the bank and the port.

3. The semiconductor memory device as recited in claim 2, wherein the receiver includes:
a current mirror block for mirroring the current in the global data bus to output the current as the data; and
a latch block for latching the data outputted from the current mirror block.

4. The semiconductor memory device as recited in claim 3, wherein the current mirror block includes:
a current mirror for mirroring the current;
a current control block coupled between the current mirror and the global data bus for controlling amount of the current; and
a third switching block coupled to the current control block for enabling the output of the current mirror in response to a data control signal.

5. The semiconductor memory device as recited in claim 4, wherein the latch block includes:
an inverting block controlled by a data enable signal for inverting the data outputted from the current mirror block; and
a latch for latching the data.

6. The semiconductor memory device as recited in claim 5, wherein the current mirror includes:
a first PMOS transistor having a gate, a drain and a source, the gate and drain diode-connected, the source connected to a supply voltage; and
a second PMOS transistor having a gate, a drain and a source, the drain connected to an output node, the source connected to a supply voltage, the gate connected to the gate of the first PMOS transistor.

7. The semiconductor memory device as recited in claim 6, wherein the current control block includes:
a first NMOS transistor having a gate, a drain and a source, the gate coupled to a reference voltage, the source connected to the drain of the first PMOS transistor and the drain connected to the global data bus; and
a second NMOS transistor having a gate, a drain and a source, the gate coupled to the reference voltage, the source connected to the drain of the second PMOS.

8. The semiconductor memory device as recited in claim 7, wherein the third switching block includes:
a third NMOS transistor having a gate, a drain and a source, the gate coupled to a data enable signal, the source connected to the drain of the second NMOS transistor and the drain connected to a ground.

9. The semiconductor memory device as recited in claim 5, wherein the inverting block includes:
a first PMOS transistor having a gate, a drain and a source, the gate coupled to the inverse data enable signal, the source connected to the supply voltage;
a second PMOS transistor having a gate, a drain and a source, the gate coupled to the first or second data outputted from the mirroring block, the source connected to the drain of the first PMOS transistor, the drain coupled to the latch;
a first NMOS transistor having a gate, a drain and a source, the gate coupled to the data enable signal, the drain connected to a ground; and
a second NMOS transistor having a gate, a drain and a source, the gate coupled to the first or second data outputted from the mirroring block, the drain connected to the source of the first NMOS transistor, the source coupled to the latch.

10. The semiconductor memory device as recited in claim 5, wherein the latch includes two inverters.

11. The semiconductor memory device as recited in claim 2, wherein the pull-down driver includes a NMOS transistor, coupled between the global data bus and a ground, having a gate coupled to the data.

12. The semiconductor memory device as recited in claim 1, wherein the first switching block includes a MOS transistor having a gate, a drain and a source, the gate coupled to a second control signal in response to a column command related to the bank, each of the drain and the source connected to each of the first transceivers and the global data bus.

13. The semiconductor memory device as recited in claim 1, wherein the second switching block includes a MOS transistor having a gate, a drain and a source, the gate coupled to a second control signal in response to a column command related to the port, each of the drain and the source connected to each of the second transceivers and the global data bus.

* * * * *